(12) United States Patent
Xie et al.

(10) Patent No.: US 10,665,586 B2
(45) Date of Patent: May 26, 2020

(54) METHOD OF CONCURRENTLY FORMING SOURCE/DRAIN AND GATE CONTACTS AND RELATED DEVICE

(71) Applicant: GLOBALFOUNDRIES Inc., Grand Cayman (KY)

(72) Inventors: Ruilong Xie, Niskayuna, NY (US); Cheng Chi, Jersey City, NJ (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 246 days.

(21) Appl. No.: 15/708,911

(22) Filed: Sep. 19, 2017

(65) Prior Publication Data

US 2018/0006028 A1 Jan. 4, 2018

Related U.S. Application Data

(62) Division of application No. 15/170,109, filed on Jun. 1, 2016, now Pat. No. 9,837,402.

(51) Int. Cl.
*H01L 27/088* (2006.01)
*H01L 29/66* (2006.01)
(Continued)

(52) U.S. Cl.
CPC ........ *H01L 27/088* (2013.01); *H01L 21/0217* (2013.01); *H01L 21/02636* (2013.01); *H01L 21/28518* (2013.01); *H01L 21/28562* (2013.01); *H01L 21/28568* (2013.01); *H01L 21/31051* (2013.01); *H01L 21/76843* (2013.01); *H01L 21/76897* (2013.01); *H01L 21/823418* (2013.01); *H01L 21/823475* (2013.01); *H01L 23/485* (2013.01); *H01L 29/0847* (2013.01); *H01L 29/41775* (2013.01); *H01L 29/45* (2013.01); *H01L 29/66515* (2013.01); *H01L 29/66795* (2013.01); *H01L 21/31144* (2013.01);
(Continued)

(58) Field of Classification Search
CPC .......... H01L 21/7685; H01L 21/76852; H01L 21/76849; H01L 21/28518; H01L 29/41775
See application file for complete search history.

(56) References Cited

U.S. PATENT DOCUMENTS 8,124,531 B2   2/2012   Chandrashekar et al.
2010/0055904 A1   3/2010   Chen et al.
(Continued)

*Primary Examiner* — Jesse Y Miyoshi
(74) *Attorney, Agent, or Firm* — Ditthavong & Steiner, P.C.

(57) ABSTRACT

A method of concurrently forming source/drain contacts (CAs) and gate contacts (CBs) and device are provided. Embodiments include forming metal gates (PC) and source/drain (S/D) regions over a substrate; forming an ILD over the PCs and S/D regions; forming a mask over the ILD; concurrently patterning the mask for formation of CAs adjacent a first portion of each PC and CBs over a second portion of the PCs; etching through the mask, forming trenches extending through the ILD down to a nitride capping layer formed over each PC and a trench silicide (TS) contact formed over each S/D region; selectively growing a metal capping layer over the TS contacts formed over the S/D regions; removing the nitride capping layer from the second portion of each PC; and metal filling the trenches, forming the CAs and CBs.

20 Claims, 7 Drawing Sheets

(51) Int. Cl.
  *H01L 29/45*  (2006.01)
  *H01L 29/08*  (2006.01)
  *H01L 21/768*  (2006.01)
  *H01L 23/485*  (2006.01)
  *H01L 29/417*  (2006.01)
  *H01L 21/02*  (2006.01)
  *H01L 21/3105*  (2006.01)
  *H01L 21/285*  (2006.01)
  *H01L 21/8234*  (2006.01)
  *H01L 21/311*  (2006.01)

(52) U.S. Cl.
  CPC ............ *H01L 21/823425* (2013.01); *H01L 21/823437* (2013.01); *H01L 29/66628* (2013.01)

(56) References Cited

U.S. PATENT DOCUMENTS

| | | | | |
|---|---|---|---|---|
| 2011/0006425 | A1* | 1/2011 | Wada | H01L 21/76807 |
| | | | | 257/750 |
| 2011/0062502 | A1* | 3/2011 | Yin | H01L 21/76816 |
| | | | | 257/288 |
| 2013/0295756 | A1* | 11/2013 | Yuan | H01L 21/823475 |
| | | | | 438/586 |
| 2013/0307032 | A1 | 11/2013 | Kamineni et al. | |
| 2015/0206804 | A1* | 7/2015 | Liou | H01L 21/823475 |
| | | | | 257/368 |

\* cited by examiner

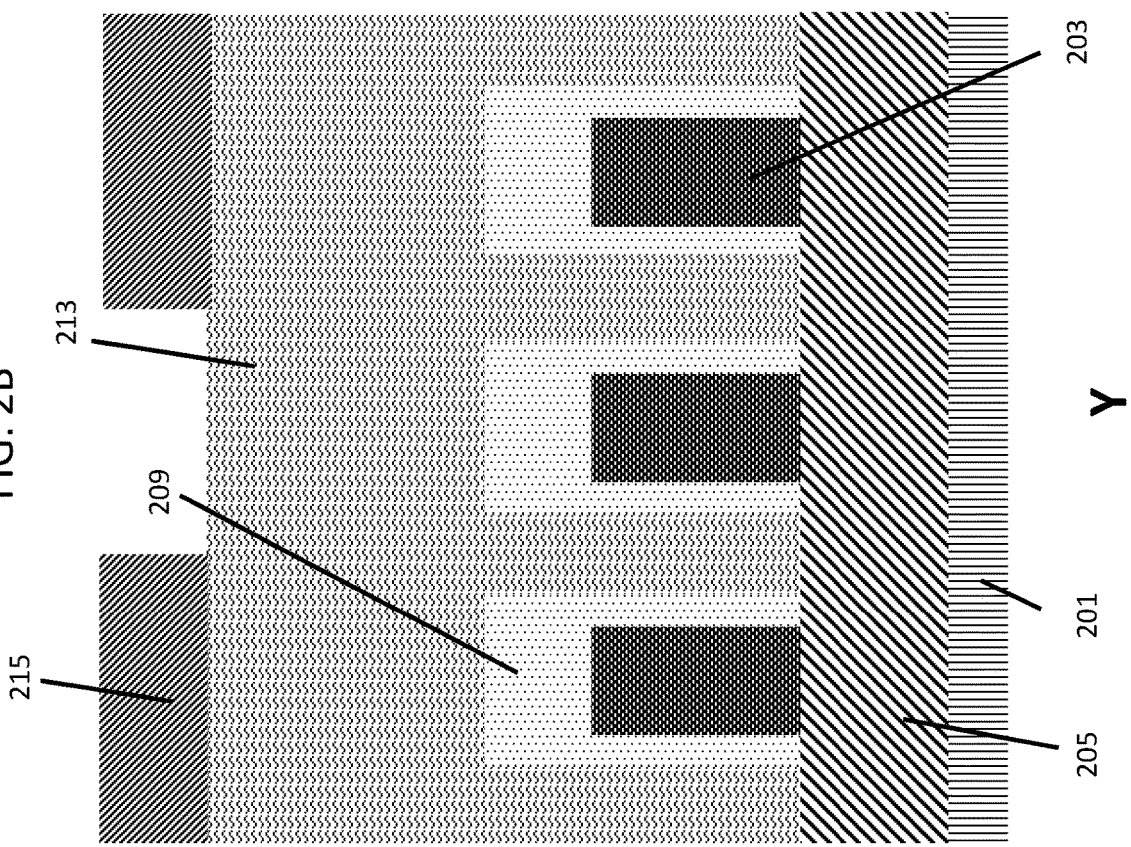
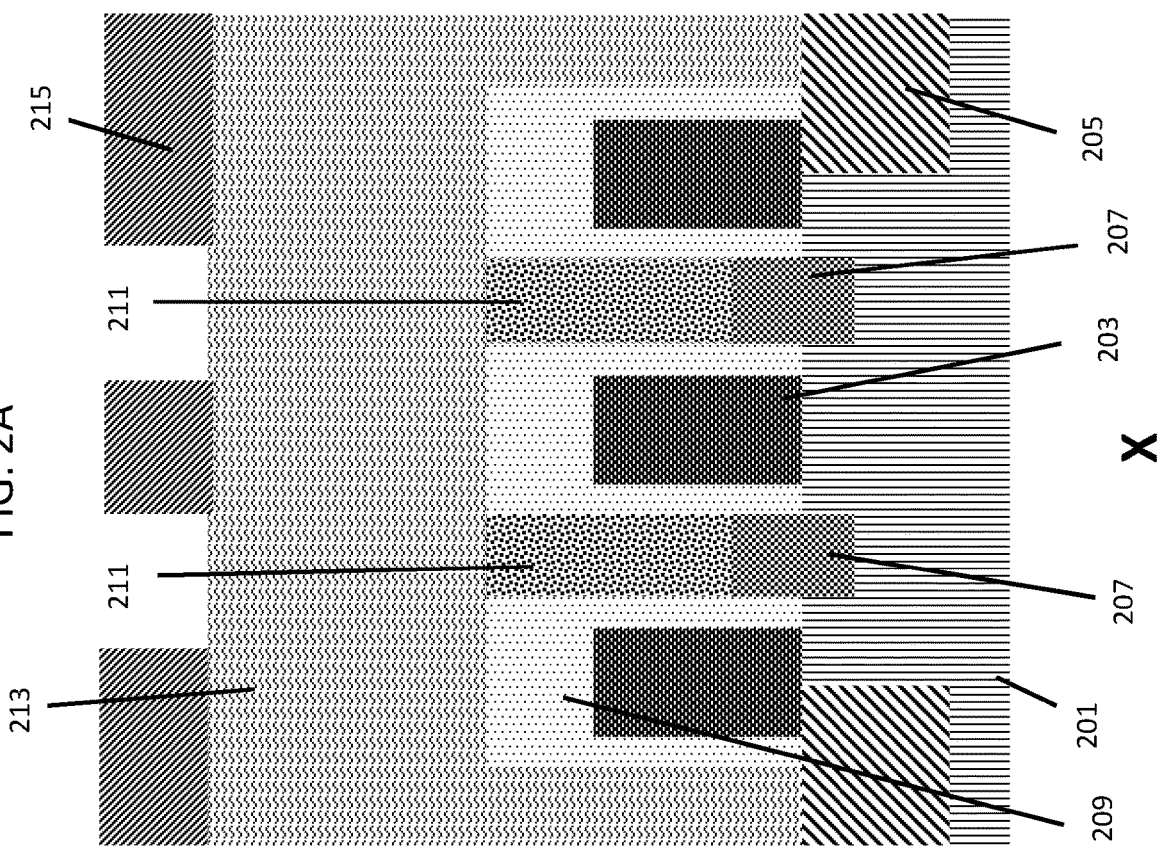

METHOD OF CONCURRENTLY FORMING SOURCE/DRAIN AND GATE CONTACTS AND RELATED DEVICE

RELATED APPLICATION

The present application is a Divisional of application Ser. No. 15/170,109, filed on Jun. 1, 2016, which is incorporated herein by reference in its entirety.

TECHNICAL FIELD

The present disclosure relates to semiconductor processing. In particular, the present disclosure relates to a contact formation technique for highly scaled complementary metal-oxide semiconductor (CMOS) technology.

BACKGROUND

For advanced CMOS technology nodes, middle of line (MOL) patterning utilizes extreme ultraviolet (EUV) lithography because contact pitch is so small and it also avoids misalignment error due to multiple color patterning. However, current patterning schemes still print source/drain contacts (CAs) and gate contacts (CBs) separately, because reactive ion etching (RIE) for CAs has different requirements from RIE for CBs, and two expensive EUV masks are required. First, CA RIE only etches oxide and needs to be selective to gate cap material (e.g. silicon nitride (SiN)) to avoid a CA to gate (PC) electrical short. Secondly, CB RIE needs to open the gate cap to make contact to the PC.

FIG. 1 shows a top view of a semiconductor device including a PCs 101 formed over an active region 103 including source/drain (S/D) regions on sides of the PCs 101. CAs 105 are formed over the active region 103, and a CB 107 is formed over the PC 101.

A need therefore exists for methodology enabling concurrent formation of CAs and CBs with a single mask and the related device.

SUMMARY

An aspect of the present disclosure is a process to concurrently print CAs and CBs with a single EUV mask to reduce production costs and to eliminate the misalignment error between CAs and CBs and thereby reduce the risk of having CB to CA electrical shorts.

Another aspect is a device including a metal capping layer formed between the TS contacts and the CAs, the metal capping layer covering a corner portion of the nitride capping layer of an adjacent PC.

Additional aspects and other features of the present disclosure will be set forth in the description which follows and in part will be apparent to those having ordinary skill in the art upon examination of the following or may be learned from the practice of the present disclosure. The advantages of the present disclosure may be realized and obtained as particularly pointed out in the appended claims.

According to the present disclosure, some technical effects may be achieved in part by a method including forming metal PCs and S/D regions over a substrate; forming an interlayer dielectric (ILD) over the PCs and S/D regions; forming a mask over the ILD; concurrently patterning the mask for formation of CAs adjacent a first portion of each PC and CBs over a second portion of the PCs; etching through the mask, forming trenches extending through the ILD down to a nitride capping layer formed over each PC and a trench silicide (TS) contact formed over each S/D region; selectively growing a metal capping layer over the TS contacts formed over the S/D regions; removing the nitride capping layer from the second portion of each PC; and metal filling the trenches, forming the CAs and CBs.

Aspects of the present disclosure include removing the mask prior to selectively growing the metal capping layer. Other aspects include selectively growing a tungsten (W) or cobalt (Co) metal capping layer over the TS contacts. Other aspects include growing the metal capping layer to a thickness of 5 to 10 nanometers (nm). Additional aspects include forming the metal capping layer to cover any exposed corner of the nitride capping layer of an adjacent PC. Certain aspects include forming an organic planarization layer (OPL) mask over the oxide ILD. Other aspects include forming the oxide ILD comprising a high density plasma (HDP) oxide, plasma-enhanced chemical vapor deposition (PECVD) oxide, or tetraethyl orthosilicate (TEOS) oxide over the PCs. Further aspects include removing the nitride capping layer by etching selective to the oxide ILD and metal of the PCs. Yet other aspects include the nitride capping layer including SiN. In certain aspects, the PCs include high-k metal gate (HKMG). Additional aspects include forming the S/D regions by selective epitaxy.

Another aspect of the present disclosure is a device including metal PCs formed over a substrate, each metal gate having a nitride capping layer over a first portion; S/D regions formed on sides of the first portion of the PCs; trench silicide (TS) contacts formed over the S/D regions; CAs formed over the TS contacts; CBs formed over a second portion of the PCs; an ILD formed over the PCs and between the CAs and CBs; and a metal capping layer formed between the TS contacts and the CAs, the metal capping layer covering a corner portion of the nitride capping layer of an adjacent PC.

Aspects include the nitride capping layer including SiN. Other aspects include the PCs including HKMGs. Additional aspects include the S/D regions comprise selective epitaxy S/D regions. Yet other aspects include the metal capping layer including W or Co. Yet further aspects include the metal capping layer having a thickness of 5 to 10 nm and the ILD including a HDP oxide, PECVD oxide, or TEOS oxide.

Another aspect of the present disclosure is a method including forming metal PCs and S/D regions over a substrate; forming an ILD over the PCs and S/D regions; forming an OPL mask over the ILD; concurrently patterning the OPL mask for formation of CA contacts adjacent a first portion of each PC and CBs over a second portion of the PCs; etching through the mask, forming trenches extending through the ILD down to a SiN capping layer formed over each the PC and a TS contact formed over each S/D region; removing the mask; selectively growing a metal capping layer to a thickness of 5 to 10 nm over the TS contacts formed over the S/D regions; removing the SiN capping layer from the second portion of each PC; and metal filling the trenches to form the CAs and CBs.

Aspects include the metal capping layer including W or Co. Additional aspects include forming the metal capping layer to cover any exposed corner of the nitride capping layer of an adjacent PC.

Additional aspects and technical effects of the present disclosure will become readily apparent to those skilled in the art from the following detailed description wherein embodiments of the present disclosure are described simply by way of illustration of the best mode contemplated to carry out the present disclosure. As will be realized, the present disclosure is capable of other and different embodiments, and its several details are capable of modifications in various obvious respects, all without departing from the present disclosure. Accordingly, the drawings and description are to be regarded as illustrative in nature, and not as restrictive.

BRIEF DESCRIPTION OF THE DRAWINGS

The present disclosure is illustrated by way of example, and not by way of limitation, in the figures of the accompanying drawing and in which like reference numerals refer to similar elements and in which:

FIGS. 2A through 7A illustrate cross-sectional views along directional arrow X in FIG. 1, and FIGS. 2B through 7B illustrate cross-sectional views along directional arrow Y in FIG. 1, of a process for fabricating a semiconductor device, in accordance with an exemplary embodiment.

DETAILED DESCRIPTION

In the following description, for the purposes of explanation, numerous specific details are set forth in order to provide a thorough understanding of exemplary embodiments. It should be apparent, however, that exemplary embodiments may be practiced without these specific details or with an equivalent arrangement. In other instances, well-known structures and devices are shown in block diagram form in order to avoid unnecessarily obscuring exemplary embodiments. In addition, unless otherwise indicated, all numbers expressing quantities, ratios, and numerical properties of ingredients, reaction conditions, and so forth used in the specification and claims are to be understood as being modified in all instances by the term "about."

The present disclosure addresses and solves the current problems of CB to CA misalignment and higher costs associated with additional masks used to produce CAs and CBs. Methodology in accordance with embodiments of the present disclosure includes forming metal PCs and S/D regions over a substrate; forming an ILD over the PCs and S/D regions; forming a mask over the ILD; concurrently patterning the mask for formation of CAs adjacent a first portion of each PC and CBs over a second portion of the PCs; etching through the mask, forming trenches extending through the ILD down to a nitride capping layer formed over each PC and a TS contact formed over each S/D region; selectively growing a metal capping layer over the TS contacts formed over the S/D regions; removing the nitride capping layer from the second portion of each PC; and metal filling the trenches, forming the CAs and CBs.

Still other aspects, features, and technical effects will be readily apparent to those skilled in this art from the following detailed description, wherein preferred embodiments are shown and described, simply by way of illustration of the best mode contemplated. The disclosure is capable of other and different embodiments, and its several details are capable of modifications in various obvious respects. Accordingly, the drawings and description are to be regarded as illustrative in nature, and not as restrictive.

Figure 1:
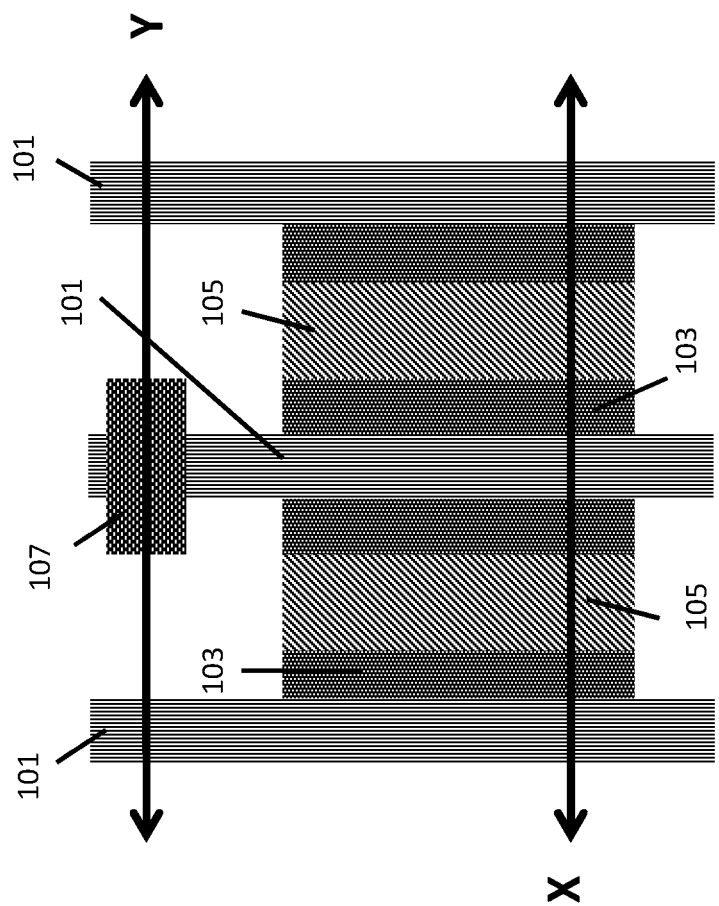
FIG. 1 schematically illustrates a top view of a conventional semiconductor device.

Adverting to FIGS. 2A and 2B, cross sectional views of a semiconductor device along directional arrow X (FIG. 1) and directional arrow Y (FIG. 1) are respectively shown. Substrate 201 is provided over which a plurality of metal PCs 203 are formed. The PCs include high-k metal gates (HKMGs) including sidewall spacers composed of SiN, SiBCN, SiOC. PCs on the edges of FIGS. 2A and 2B may be dummy PCs at the edges of a cell, and the other PCs (only one is shown for illustrative convenience) are active PCs. STI regions 205 are formed under the metal PCs 203 outside of the active region (as in FIG. 2B) and under the dummy PCs in the active region (as in FIG. 2A). S/D regions 207 are formed at opposite sides of the active metal PCs 203. The S/D regions 207 include selective epitaxy S/D regions. A SiN capping layer 209 is formed on upper of the metal PCs 203. TS contacts 211 are formed over the S/D regions 207 and between the metal PCs 203. The TS contacts 211 are formed of silicide at a bottom (e.g. nickel (Ni), titanium (Ti) or a nickel platinum (NiPt) silicide) with a conducting metal at a top (e.g W or Co, with a thin nucleation/adhesion layer formed at sidewall). An ILD 213 is formed over and between the metal PCs 203. The ILD 213 includes an oxide (e.g. plasma-enhanced chemical vapor deposition (PECVD) oxide, HDP oxide, tetraethyl orthosilicate (TEOS) oxide, etc). A mask 215 is concurrently patterned for CAs and CBs over the ILD 213 using either conventional optical lithography if the dimension is relaxed or EUV lithography for advanced technology node. The final pattern is transferred to mask material 215, which could be an OPL. The patterning of the mask 215 corresponds to the CAs and CBs to be formed in the ILD 213.

Figure 3B:
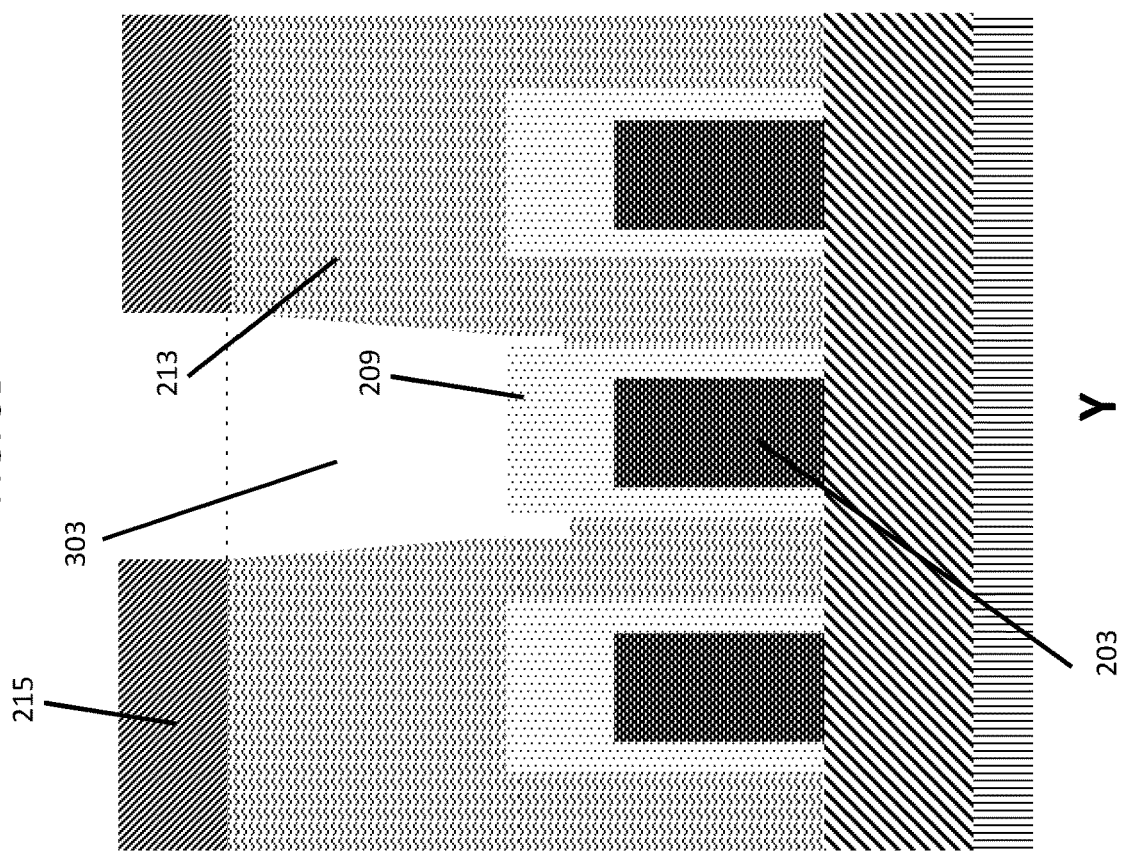
Figure 3A:
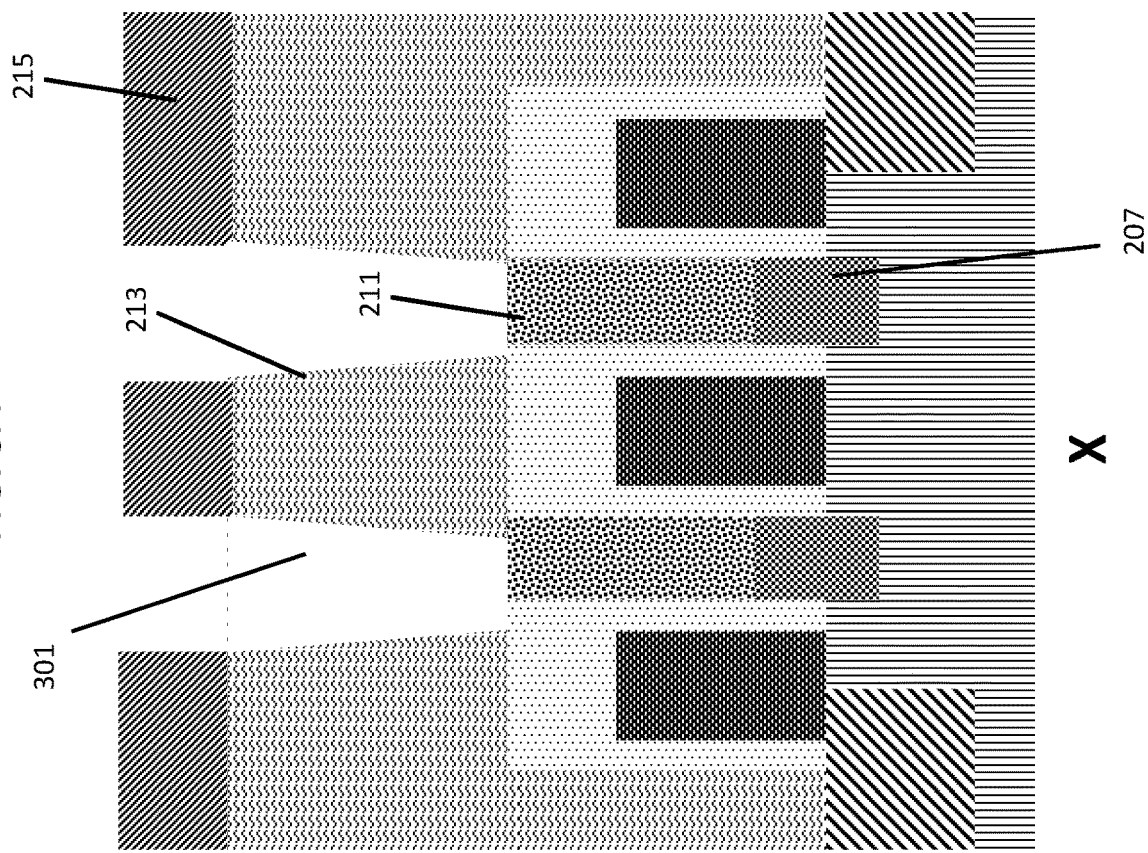
Figure 4B:
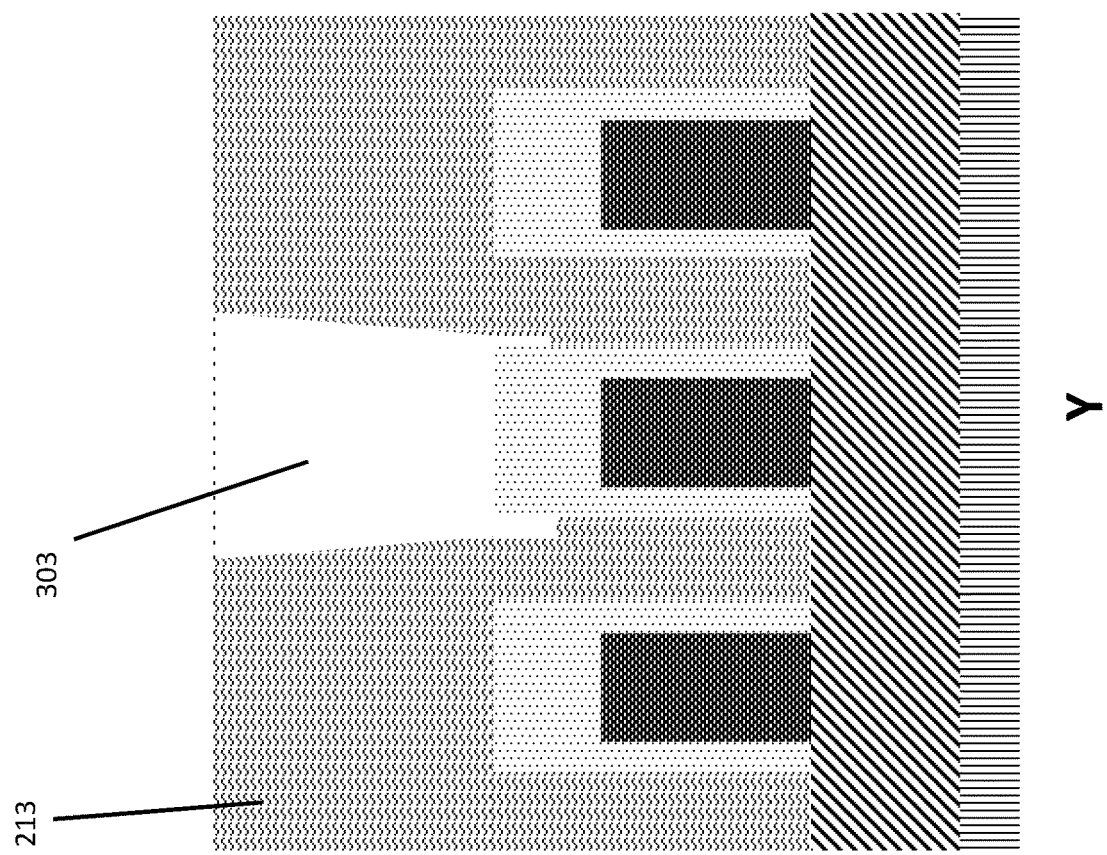
Figure 4A:
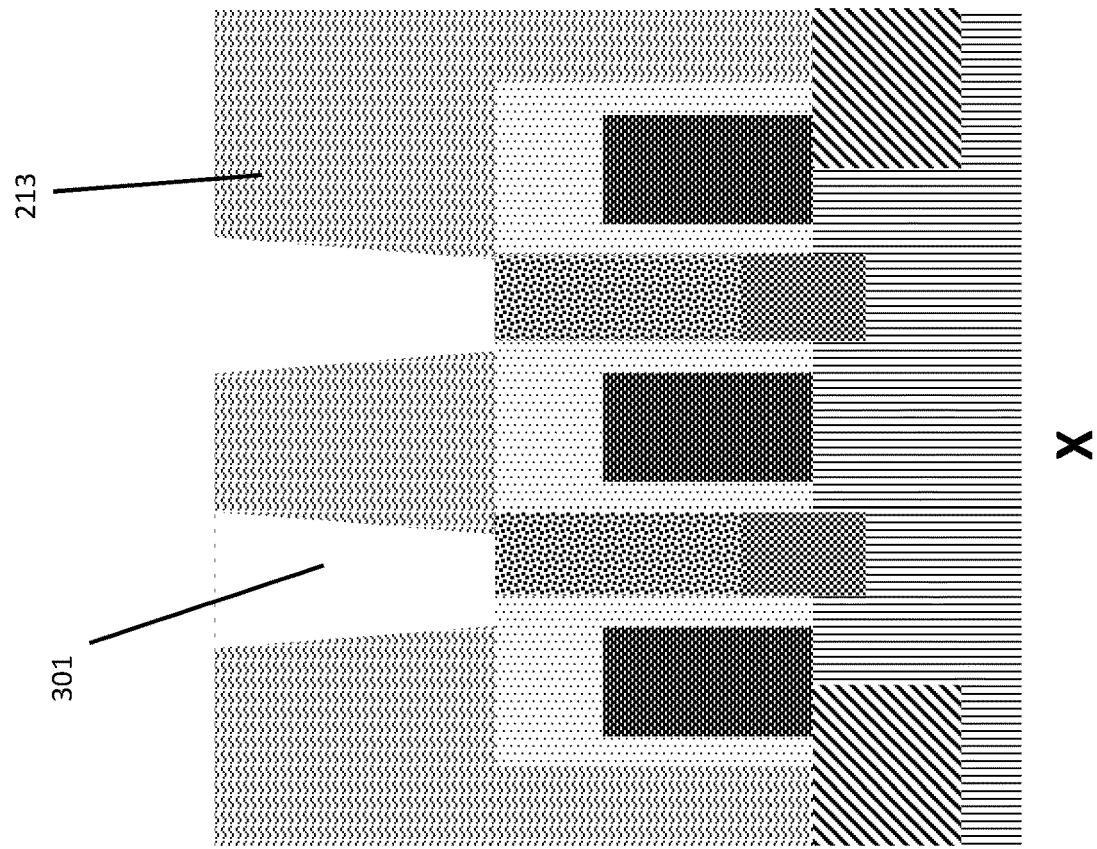

Adverting to FIGS. 3A and 3B, an etching step is performed through the mask 215, forming trenches 301 and 303 extending through the ILD 213 down to the TS contacts 211 formed over each S/D region 207 and the SiN capping layer 209 formed over each active PC 203, respectively. The etching step includes an oxide etch which is selective to SiN. The trenches 301 and 303 are formed at an offset such that the CAs will contact the TS contacts in a first portion of the PCs 203, and the CBs will contact a second portion of the PCs 203. Following the etching step through mask 215, the mask 215 is removed, as shown in FIGS. 4A and 4B to expose an upper surface of the ILD 213.

Figure 5B:
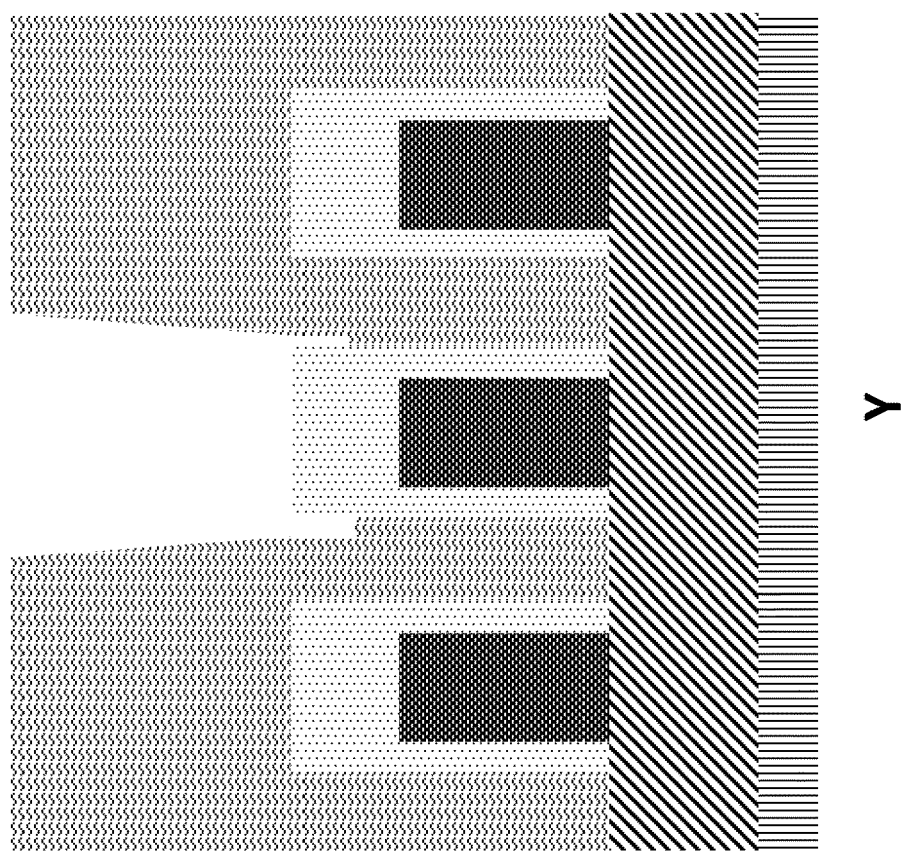
Figure 5A:
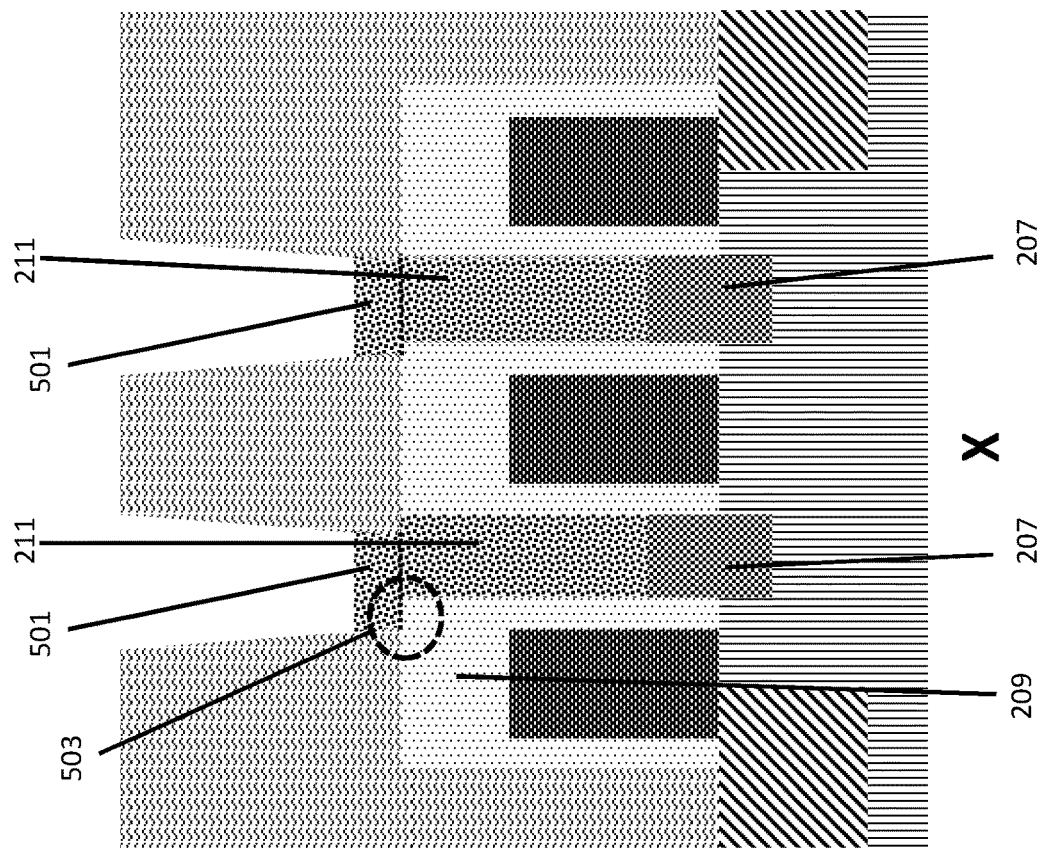

Adverting to FIGS. 5A and 5B, a metal capping layer 501 is selectively grown over the TS contacts 211 formed over the S/D regions 207. The metal capping layer 501 is formed of W or Co. The TS contacts 211 can be the same metal or different from the metal capping layer 501. The metal capping layer 501 is grown to a thickness of 5 to 10 nm over the TS contacts 211. As shown by circled region 503, a corner of the SiN capping layer 209 is covered with the metal capping layer 501. The metal capping layer 501 is formed to cover any exposed corner of the nitride capping layer 209 of an adjacent PC 203.

Figure 6B:
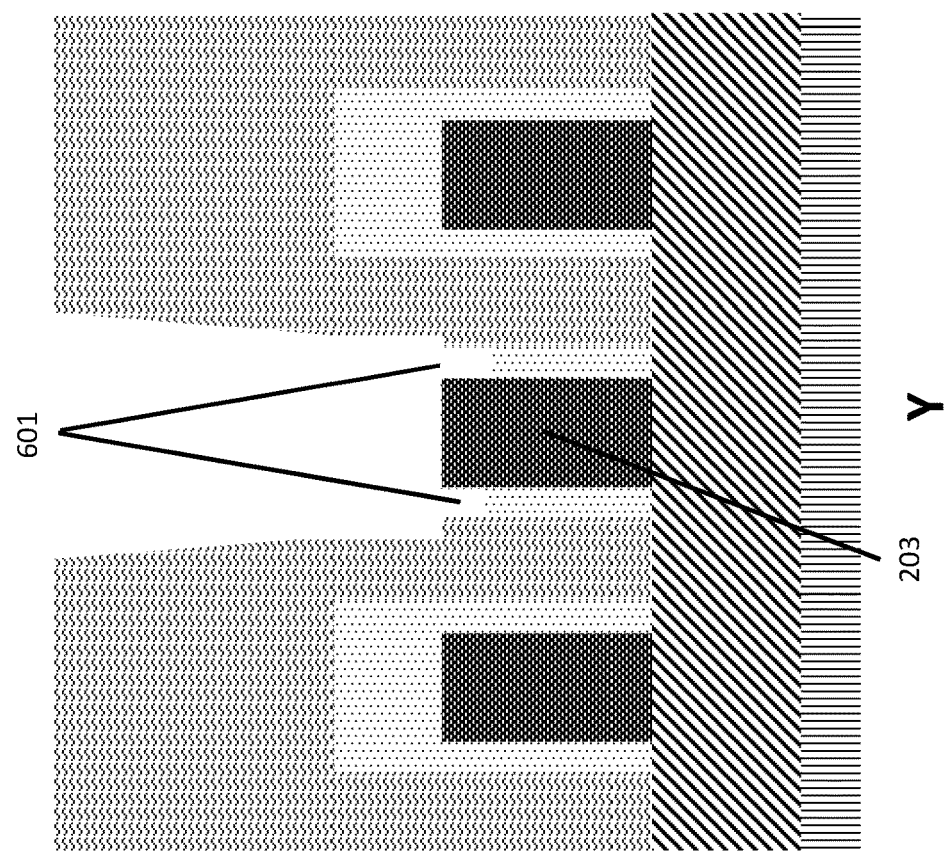
Figure 6A:
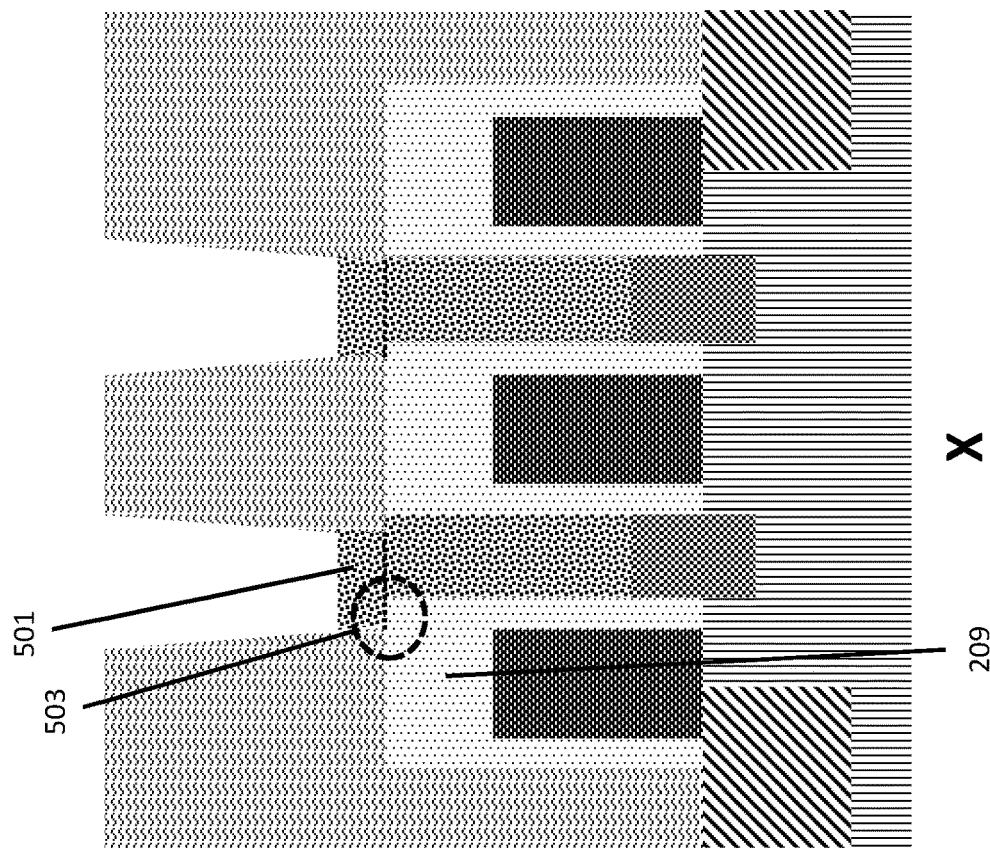

Adverting to FIGS. 6A and 6B, the SiN capping layer 209 is removed from the second portion of each PC 203 by a SiN open etch that is selective to oxide and metal. Openings 601 are formed on the sides of the PCs 203, and an upper surface of the PCs is exposed. This SiN open etching step does not adversely affect the circled region 503 since this corner of the SiN capping layer 209 is covered and protected by the metal capping layer 501.

Figure 7B:
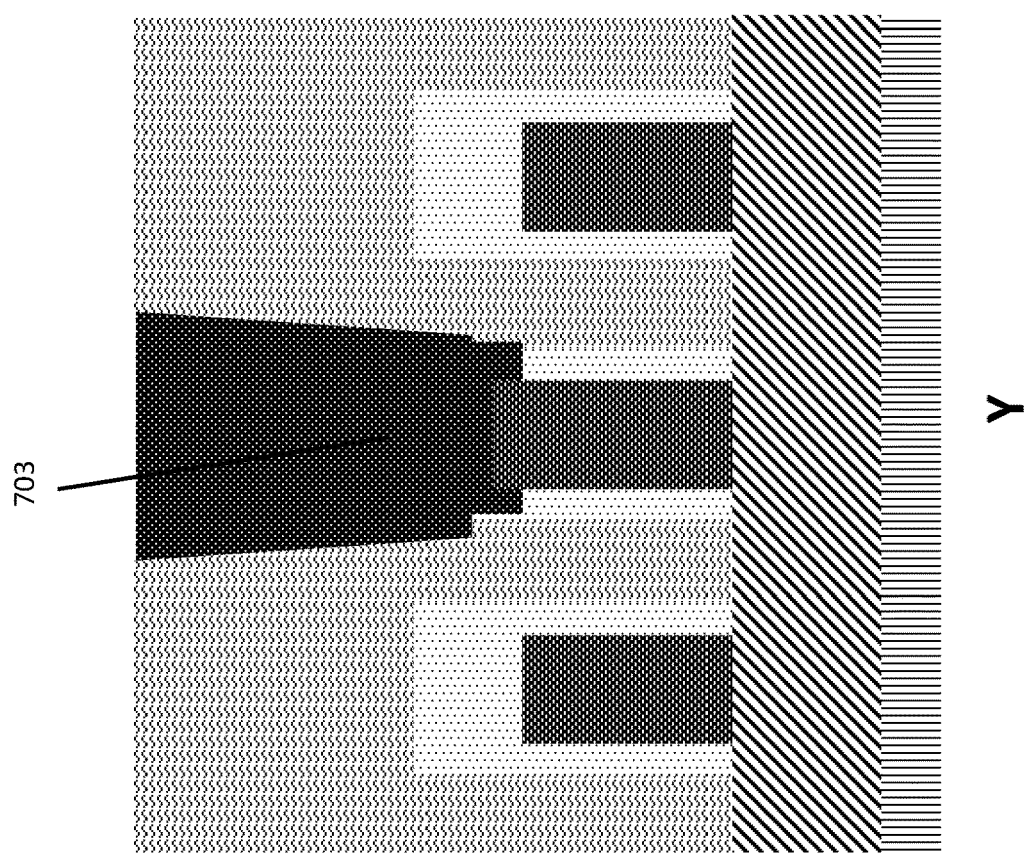
Figure 7A:
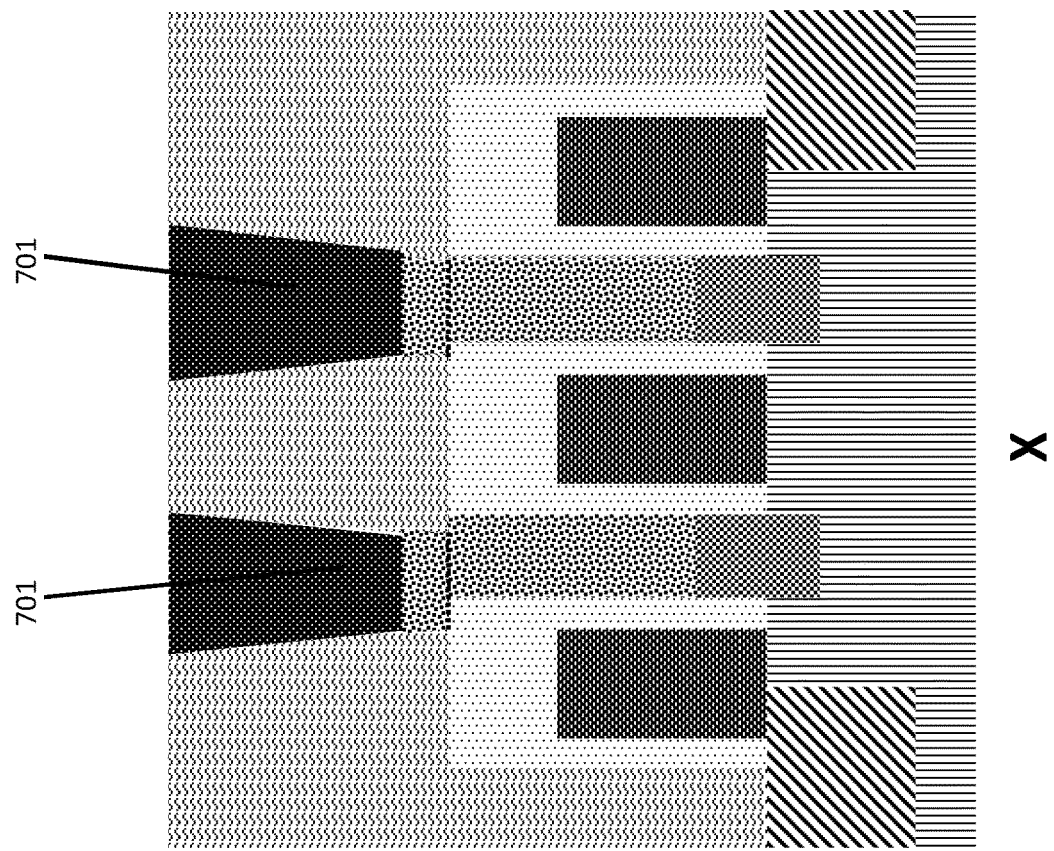

Adverting to FIGS. 7A and 7B, a metal filling of the trenches forms the CAs 701 and the CB 703. Although not shown, a metal liner can be formed in the trenches prior to the metal filling step. Suitable metals for the metal filling step include copper (Cu), titanium (Ti), W, Co, and aluminum (Al).

The embodiments of the present disclosure can achieve several technical effects, including concurrently forming CAs and CBs using a single EUV mask and eliminating misalignment between CAs and CBs, which in turn reduces the risk of CB to CA shorts. The present disclosure enjoys industrial applicability in any of various industrial applications, e.g., microprocessors, smart phones, mobile phones, cellular handsets, set-top boxes, DVD recorders and players, automotive navigation, printers and peripherals, networking and telecom equipment, gaming systems, and digital cameras. The present disclosure therefore enjoys industrial applicability in any of various types of highly integrated semiconductor devices, particularly for advanced technology nodes.

In the preceding description, the present disclosure is described with reference to specifically exemplary embodiments thereof. It will, however, be evident that various modifications and changes may be made thereto without departing from the broader spirit and scope of the present disclosure, as set forth in the claims. The specification and drawings are, accordingly, to be regarded as illustrative and not as restrictive. It is understood that the present disclosure is capable of using various other combinations and embodiments and is capable of any changes or modifications within the scope of the inventive concept as expressed herein.

What is claimed is:

1. A device comprising:
   metal gates (PC) formed over a substrate, each metal gate having a nitride capping layer over a first portion;
   source/drain (S/D) regions formed on sides of the first portion of the PCs;
   trench silicide (TS) contacts formed over the S/D regions;
   source/drain contacts (CAs) formed over the TS contacts;
   gate contacts (CBs) formed over a second portion of the PCs;
   an interlayer dielectric (ILD) formed over the PCs and between the CAs and CBs; and
   a metal capping layer formed between the TS contacts and the CAs, the metal capping layer covering a portion of the TS contact and an upper surface portion of the nitride capping layer of an adjacent PC.

2. The device according to claim 1, wherein the nitride capping layer comprises silicon nitride (SiN).

3. The device according to claim 1, wherein the PCs comprise high-k metal gates (HKMGs).

4. The device according to claim 1, wherein the S/D regions comprise selective epitaxy S/D regions.

5. The device according to claim 1, wherein the metal capping layer comprises tungsten (W) or cobalt (Co).

6. The device according to claim 5, wherein the metal capping layer has a thickness of 5 to 10 nanometers (nm).

7. The device according to claim 6, wherein the ILD comprises a high density plasma (HDP) oxide, plasma-enhanced chemical vapor deposition (PECVD) oxide, or tetraethyl orthosilicate (TEOS) oxide.

8. A device comprising:
   high-k metal gates (HKMGs) formed over a substrate, each metal gate having a silicon nitride (SiN) capping layer over a first portion;
   source/drain (S/D) regions formed on sides of the first portion of the HKMGs;
   trench silicide (TS) contacts formed over the S/D regions;
   source/drain contacts (CAs) formed over the TS contacts;
   gate contacts (CBs) formed over a second portion of the HKMGs;
   an interlayer dielectric (ILD) formed over the HKMGs and between the CAs and CBs; and
   a metal capping layer formed between the TS contacts and the CAs, the metal capping layer covering a portion of the TS contact and an upper surface portion of the SiN capping layer of an adjacent HKMG.

9. The device according to claim 8, wherein the S/D regions comprise selective epitaxy S/D regions.

10. The device according to claim 8, wherein the metal capping layer comprises tungsten (W) or cobalt (Co).

11. The device according to claim 10, wherein the metal capping layer has a thickness of 5 to 10 nanometers (nm).

12. The device according to claim 11, wherein the ILD comprises a high density plasma (HDP) oxide, plasma-enhanced chemical vapor deposition (PECVD) oxide, or tetraethyl orthosilicate (TEOS) oxide.

13. A device comprising:
   gates (PC) having a nitride capping layer over a first portion;
   source/drain (S/D) regions formed on sides of the first portion of the PCs;
   trench silicide (TS) contacts formed over the S/D regions;
   source/drain contacts (CAs) formed over the TS contacts;
   gate contacts (CBs) formed over a second portion of the PCs; and
   a capping layer formed between the TS contacts and the CAs, the capping layer covering a portion of the TS contact and an upper surface portion of the nitride capping layer of an adjacent PC.

14. The device according to claim 13, further comprising:
   an interlayer dielectric (ILD) formed over the PCs and between the CAs and CBs.

15. The device according to claim 14, wherein the ILD comprises a high density plasma (HDP) oxide, plasma-enhanced chemical vapor deposition (PECVD) oxide, or tetraethyl orthosilicate (TEOS) oxide.

16. The device according to claim 13, wherein the nitride capping layer comprises silicon nitride (SiN).

17. The device according to claim 13, wherein the PCs comprise high-k metal gates (HKMGs).

18. The device according to claim 13, wherein the S/D regions comprise selective epitaxy S/D regions.

19. The device according to claim 13, wherein the capping layer comprises tungsten (W) or cobalt (Co).

20. The device according to claim 19, wherein the capping layer has a thickness of 5 to 10 nanometers (nm).

* * * * *